(12) United States Patent
Oh et al.

(10) Patent No.: US 6,786,970 B2
(45) Date of Patent: Sep. 7, 2004

(54) EQUIPMENT FOR FABRICATING A SEMICONDUCTOR PRODUCT

(75) Inventors: Hyun-Don Oh, Suwon (KR); Tae-Sin Park, Suwon (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/939,556

(22) Filed: Aug. 28, 2001

(65) Prior Publication Data

US 2002/0055276 A1 May 9, 2002

(30) Foreign Application Priority Data

Nov. 9, 2000 (KR) ........................................ 2000-66346

(51) Int. Cl.[7] .......................... B05C 11/00; B65G 49/07
(52) U.S. Cl. .......................... 118/58; 118/600; 414/935
(58) Field of Search .............................. 438/800, 758; 118/58, 70, 600; 454/187, 188, 189; 55/383; 422/4; 427/96; 414/935

(56) References Cited

U.S. PATENT DOCUMENTS

| | | | | |
|---|---|---|---|---|
| 5,826,129 A | * | 10/1998 | Hasebe et al. | ............. 396/611 |
| 6,290,405 B1 | * | 9/2001 | Ueda | ......................... 396/611 |
| 6,295,864 B1 | * | 10/2001 | You et al. | ................. 73/53.01 |
| 6,299,363 B1 | * | 10/2001 | Ueda | ......................... 396/611 |
| 6,341,903 B1 | * | 1/2002 | Ueda | ......................... 396/611 |
| 6,399,518 B1 | * | 6/2002 | Ueda | ......................... 438/758 |

OTHER PUBLICATIONS

Grayfer et al. "Protecting 248 eta m and 193 eta m lithography from airborne molecular contaimination during semiconductor fabrication.", Proceedings of the SPIE—The International Society for Optical Engineering (USA), vol. 4346, pt 1–2, p.676–84, 2001.*

"How Clean is Your Cleanroom Air?", <URL: http://www.balazs.com/howcleanair.html>, Balzas Analytical Library, Nov. 1998, retreived on Sep. 27, 2002.*

* cited by examiner

Primary Examiner—Ernest Karlsen
Assistant Examiner—Scott B. Geyer
(74) Attorney, Agent, or Firm—Volentine Francos, PLLC

(57) ABSTRACT

A semiconductor fabricating device and method that minimize the influence of a process deteriorating material that is generated during first processes on second processes, when the plurality of processes are continually performed step by step. Operational failures are prevented during the course of the semiconductor fabricating processes, by directing air flow from a location where the second processes are carried out to a location where the first processes are carried out, to carry the process deteriorating gas away from the second processes. This reduces the frequency of failures during processing.

17 Claims, 4 Drawing Sheets

EQUIPMENT FOR FABRICATING A SEMICONDUCTOR PRODUCT

The present application claims priority under 35 U.S.C. §119 to Korean Patent Application No. 2000-66346, filed on Nov. 9, 2000, which is hereby incorporated by reference in its entirety for all purposes.

BACKGROUND OF THE INVENTION

1. Field of the Invention

The present invention relates to semiconductor fabricating equipment. More particularly, the present invention relates to semiconductor fabricating equipment that can minimize the influence of a process deteriorating material, that is generated during a first process, on a second process, whereby the first and second processes are performed step by step. This can significantly reduce the frequency of failures in patterning.

2. Description of the Related Art

In recent years, rapid developments have been made in the industrial fields of computers, information and communication, and aerospace. As a result, semiconductor products used in these various industries have become smaller, but generally perform higher functions.

The recent development trend toward lighter products with higher function in such a variety of industries has primarily resulted from an improvement in the functions of semiconductor products that can process a large quantity of data within a small unit of time, as well as a dramatic increase in the amount of data that can be stored in a given memory area. As a result, there is a continued need to accelerate the development of semiconductor products having these improved functions.

In general, the aforementioned semiconductor products have circuit wires that are precisely manufactured to have thicknesses as small as 0.1 µm or so. As a result, very fine semiconductor fabricating equipment and related methods are required to manufacture such precise semiconductor products.

Such a semiconductor fabricating method generally consists of two steps: a first (or preceding) semiconductor fabricating step, and a second (or following) semiconductor fabricating step. The combination of these two general steps is required to make a circuit pattern having wires with thicknesses as small as 0.1 µm or so.

Specifically, the first semiconductor fabricating step may include, for example, a photolithography process. In such a photolithography process, a thin photo-resistant layer that may remain or may be removed is formed by exposing light rays onto a pure silicon substrate, or wafer. A reticle, having an open part formed in relation to a circuit pattern, is placed over the photo-resistant layer to which the light rays will be exposed, and then the uncovered part of the wafer is exposed to the light rays to form a circuit pattern.

The second semiconductor fabricating step may include, for example, an ionimplantation process to implant ions into the open part; a deposition process to deposit a thin layer having different characteristics; an etching process to repeatedly form etching grooves or contact holes with an etchant or an etching gas; a metal process to electrically connect a circuit pattern; and the like.

The first and second semiconductor fabricating steps as such are generally performed in turn. At the same time, additional processes are performed to complete the fabrication of a semiconductor product. These additional processes may include making a semiconductor chip, a core part of any semiconductor product; packaging the product to make an electric connection with external devices and to protect the semiconductor chip from negative environmental factors; and testing the final semiconductor product.

When a semiconductor product is to be fabricated through a plurality of complex processes, it is preferable that a reduction in the thickness of wire be made by an improvement in the precision of the semiconductor fabricating equipment used to perform the first semiconductor fabricating step, rather than in the second semiconductor fabricating step.

In particular, in-line type photolithography equipment has been developed that sequentially includes a plurality of operational units such as a photo-resistant painting unit for pasting photo-resist to a wafer, a bake unit, an adhesion unit for improving adhesion between the wafer and the photo-resist, a stepper or a ray exposing unit, an interface unit and a developing unit, all of which are connected "in-line."

When using such in-line photolithography equipment, wafers are in sequential motion and the first semiconductor fabricating step is in process continuously on successive wafers, so as to maximize efficiency of equipment. However, hexamethyldisilane (HMDS), a chemical used at an operational unit, i.e., at the adhesion unit, generates ammonia ($NH_4$), which can result in a process failure at an adjacent process unit, e.g., at the bake unit. The problem of generating ammonia will be described in more detail below.

FIG. 1 illustrates changes in the quantity of ammonia generated from a sheet of wafers from the start to the completion of the operational processes. As shown in the graph in FIG. 1, there is a sudden change in the quantity of ammonia at some intervals, resulting in problems such as the occurrence of a T-top phenomenon, in which the top portion of the photo-resist layer remains as T-shaped, instead of forming a vertical profile after completion of wafer development at the developing unit.

SUMMARY OF THE INVENTION

The present invention is therefore directed to equipment for fabricating semiconductor products, and a method thereof, which substantially overcome one or more of the problems due to the limitations and disadvantages of the related art.

To solve the above and other problems, it is an object of the present invention to provide semiconductor fabricating equipment and a related method, that minimizes the negative influence of a material generated at one operational unit on an adjacent process unit during the course of a sequential in-line type processing.

In order to accomplish the above-noted and other objects of the present invention, a semiconductor fabricating equipment is provided comprising a first semiconductor process unit installed in a production line for performing first semiconductor fabricating processes that generate a process deteriorating gas; and a second semiconductor process unit installed in the production line for performing second semiconductor fabricating processes dependent on the first semiconductor processes, the second semiconductor processes being susceptible to operational failures if exposed to the process deteriorating gas. In this device, the second semiconductor process unit is installed at a higher level than the first semiconductor process unit, and clean air flows downward over the first and second semiconductor process units to carry the process deteriorating gas away from the second semiconductor process unit. The process deteriorating gas may be ammonia ($NH_4$), for example.

The first semiconductor process unit may comprise an adhesion unit having an adhesion chamber that supplies an adhesion enhancing material for reinforcing adhesion between a wafer and a photo-resist layer, when the photo-resist layer is deposited onto the wafer. The second semiconductor process unit may comprise a bake unit that bakes the wafer that has the photo-resist layer formed on it.

Alternatively, a semiconductor fabricating device may be provided that comprises a first semiconductor process unit installed in a production line for performing first semiconductor fabricating processes that generate a process deteriorating gas; and a second semiconductor process unit installed in the production line for performing second semiconductor fabricating processes dependent on the first semiconductor processes, the second semiconductor processes being susceptible to operational failures if exposed to the process deteriorating gas. In this device, the first semiconductor process unit is installed in a first position and the second semiconductor process unit is installed at second position, and clean air flows from the first position to the second position to carry the process deteriorating gas away from the second semiconductor process unit. The process deteriorating gas may be ammonia ($NH_4$), for example.

The first semiconductor process unit may comprise an adhesion unit having an adhesion chamber that supplies an adhesion enhancing material for reinforcing adhesion between a wafer and a photo-resist layer, when the photo-resist layer is deposited onto the wafer. The second semiconductor process unit may comprise a bake unit that bakes the wafer that has the photo-resist layer formed on it.

The above and other problems also may be overcome by a method of fabricating a semiconductor device including performing first semiconductor fabricating processes at a first location, the first semiconductor fabricating processes generating a process deteriorating gas; performing second semiconductor fabricating processes that are dependent upon the first semiconductor fabricating processes at a second location, the second semiconductor fabricating processes being susceptible to operational failures upon exposure to the process deteriorating gas; and flowing clean air from the second location to the first location to carry the process deteriorating gas away from the second location. In a preferred embodiment, the second location is higher than the first location.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

Specific structure and operational characteristics and effects of the present invention will become apparent from the following detailed description of a preferred embodiment with reference to the accompanying drawings. An in-line photolithography device 400 will be described as a preferred embodiment of the present invention.

Figure 1:
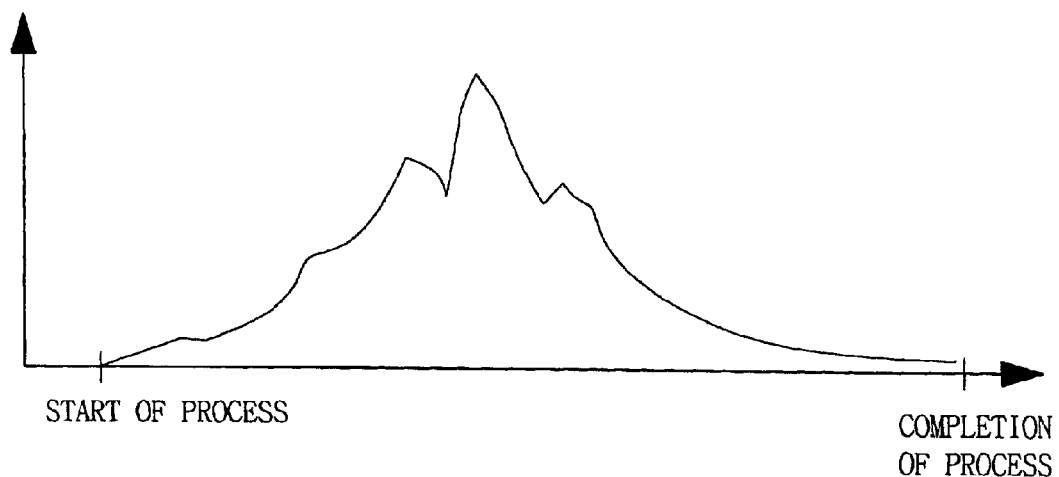
FIG. 1 is a graph illustrating the changes in density of ammonia contained in a bake unit of in-line photolithography equipment of a conventional semiconductor fabricating device.
Figure 2:
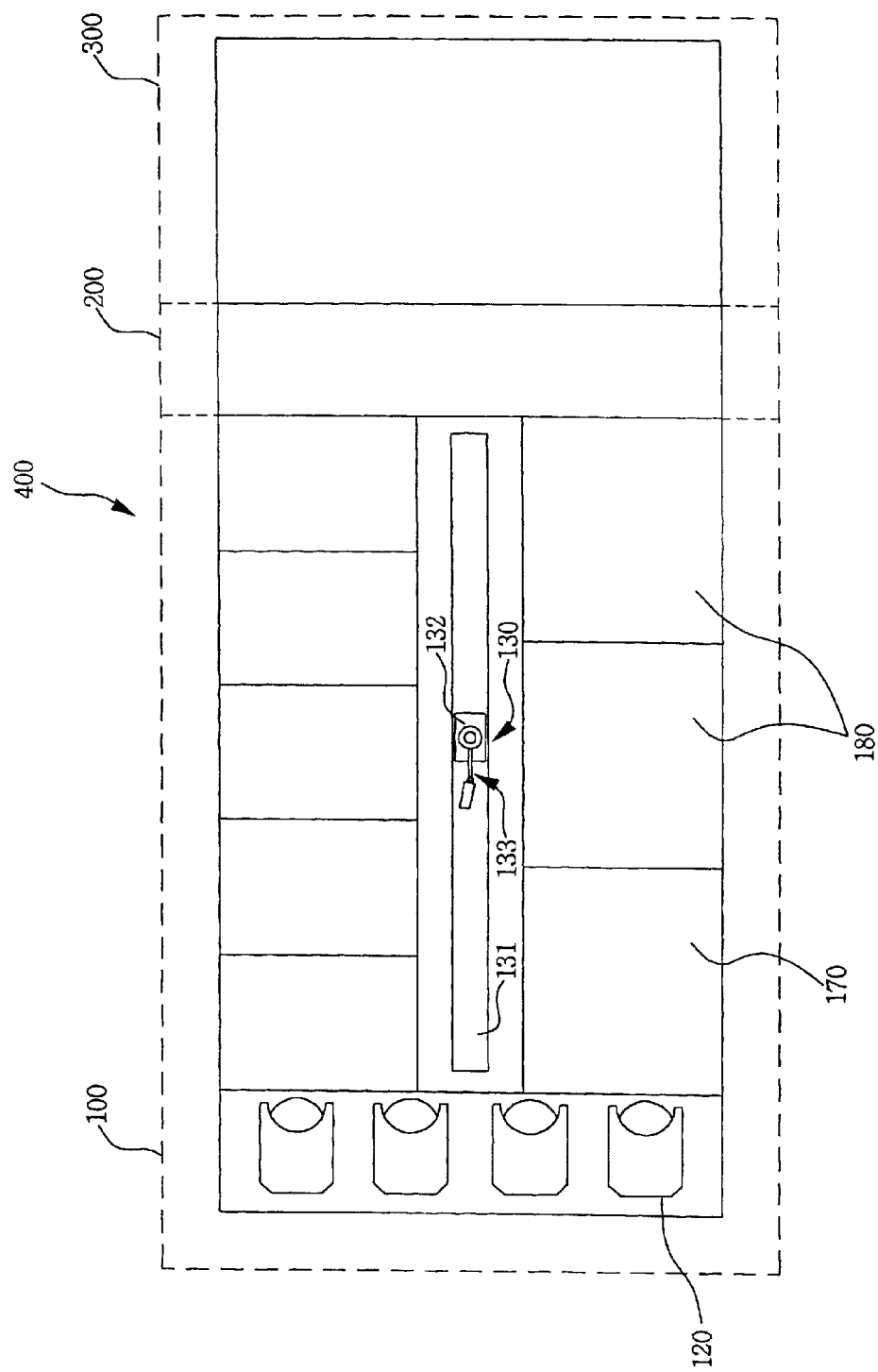
FIG. 2 is a plan view illustrating a layout of an in-line photolithography device of a semiconductor fabricating facility, according to a preferred embodiment of the present invention.
Figure 3:
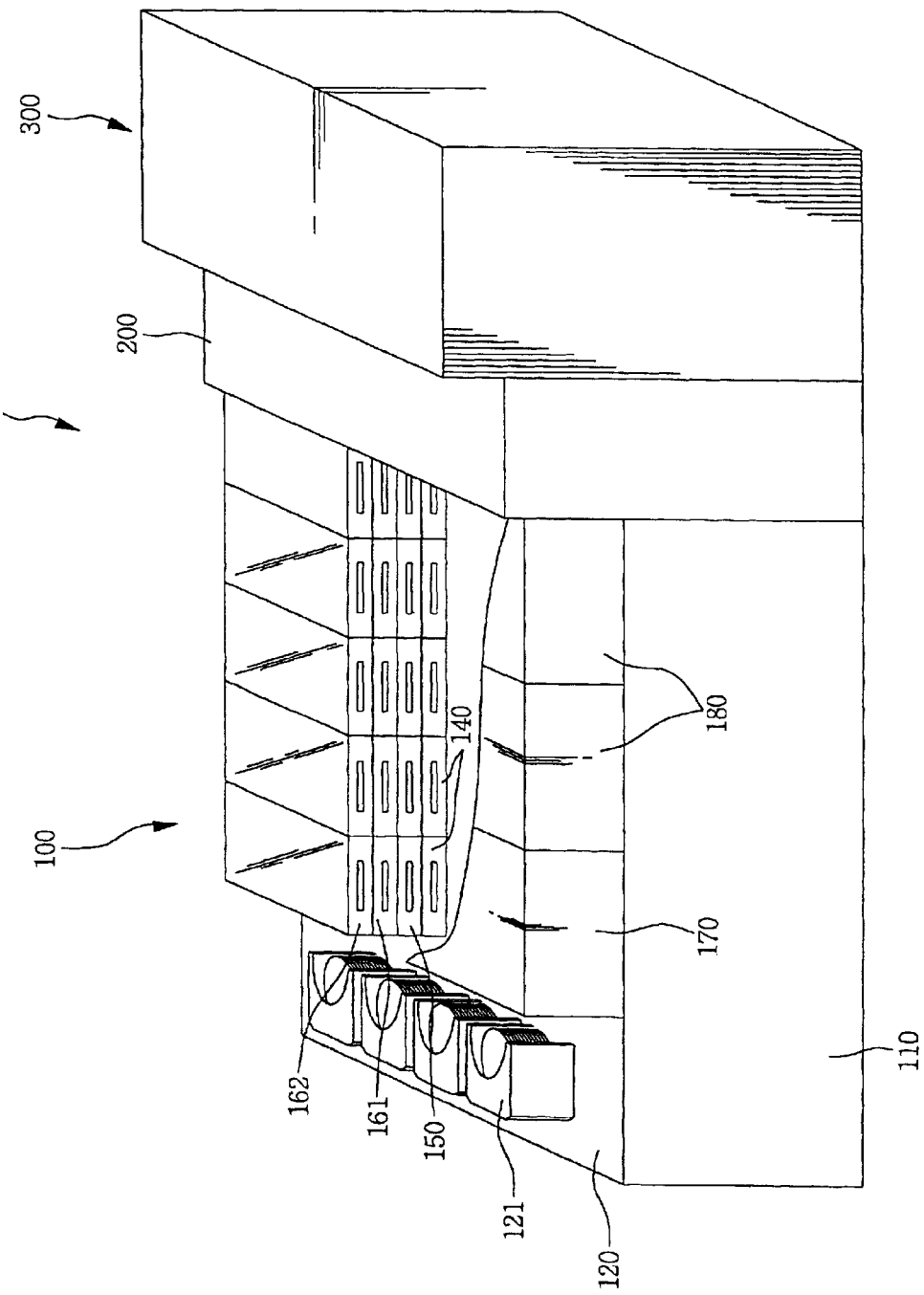
FIG. 3 is a partial, cross-sectional perspective view illustrating the in-line photolithography device of FIG. 2.
Figure 4:
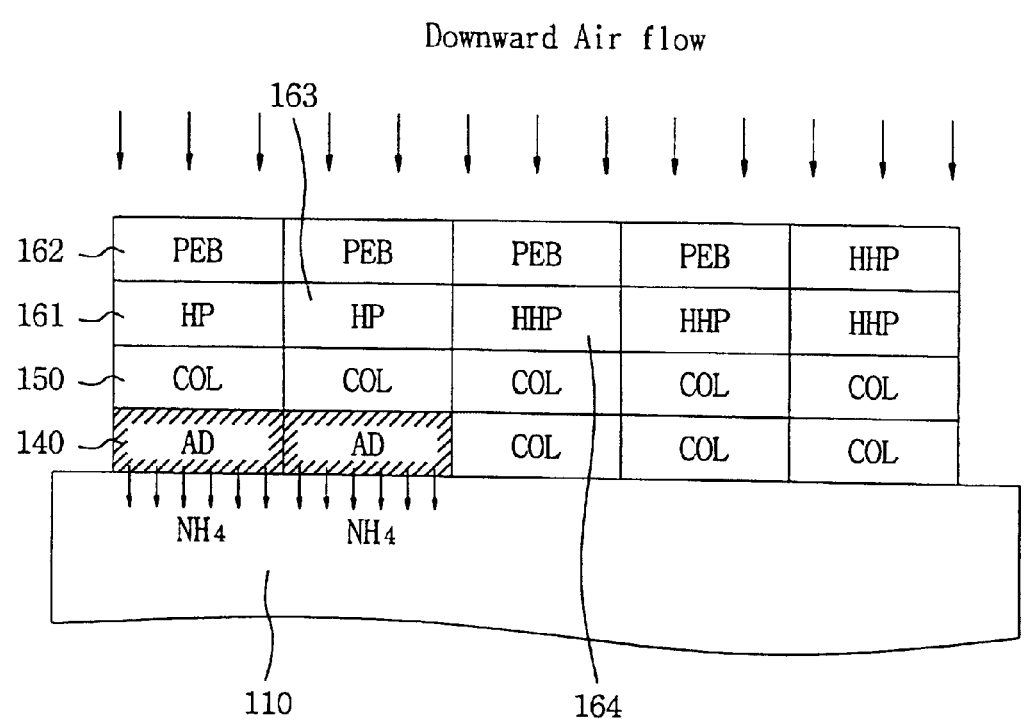
FIG. 4 is a lateral view illustrating the relationship of position of a bake unit, a cooling unit, an adhesion unit and air flow from FIGS. 2 and 3.

FIGS. 2 through 4 illustrate an in-line photolithography device according to a preferred embodiment of the present invention. In particular, FIG. 2 is a plan view illustrating a layout of an in-line photolithography device of a semiconductor fabricating facility according to a preferred embodiment of the present invention; FIG. 3 is a partial, cross-sectional perspective view illustrating the in-line photolithography device of FIG. 2; and FIG. 4 is a lateral view illustrating the relationship of position of a bake unit, a cooling unit, an adhesion unit and air flow from FIGS. 2 and 3.

As shown in these drawings, the in-line type photolithography device 400 is constructed to include a photo-resist treating unit 100, an interface buffer unit 200, and a ray exposing unit 300. The photo-resist treating unit 100 includes a plurality of operational units installed on the base body 110. The operational units specifically include a wafer cassette loading/unloading unit 120, a wafer transfer unit 130, one or more adhesion units 140, one or more cooling units 150, a plurality of bake units 161, 162, 163 (collectively referred to a bake unit 160), one or more spin coating units 170, and one or more developing units 180.

Among the operational units, the wafer cassette loading/unloading unit 120 makes it possible to load or unload one or more wafer cassettes 121, which have wafers that have completed the first semiconductor fabricating step. The wafer cassette loading/unloading unit 120 also allows the device 400 to accommodate the wafers in lot units. The wafer cassette loading/unloading unit 120 may be installed along an edge of the top surface of the base body 110 to enable the wafers to be easily loaded or unloaded. In the preferred embodiment of the present invention, four wafer cassettes 121 are accommodated in the wafer cassette loading/unloading unit 120. However, alternate embodiments may use more or fewer cassettes 121.

The spin coating unit 170 and developing unit 180 are installed in series on the top surface of the base body 110, adjacent to the wafer cassette loading/unloading unit 120. Although in this embodiment one spin coating unit 170 and two developing units 180 are disclosed, the number of these elements may be varied as necessary.

The plurality of adhesion units 140, cooling units 150, and bake units 160 are placed over the base body 110 in a deposition structure, across from the spin coating units 170 and developing units 180. The adhesion units 140, cooling units 150 and bake units 160 will be described in further detail as follows.

The adhesion units 140 (marked with the label AD in FIG. 4), supply hexamethyldisilane (HMDS) to wafers loaded in a chamber of the photolithography device. The chamber has a predetermined size of volumetric capacity. The HMDS is phase-changed into a gaseous state by way of nitrogen gas to enhance adhesion between a wafer and the photo-resist layer prior to the photo-resist painting process.

The bake unit 160 is preferably constructed to include the first bake unit 161, the second bake unit 162 and the third bake unit 163. More specifically, the first bake unit 161 is preferably a soft bake unit that first hardens a photo-resist layer after the photo-resist layer is deposited onto the wafer at the spin coating unit 170 described above. In a preferred embodiment, this operation is performed at one of those positions marked HP in FIG. 4.

The second bake unit 162 is preferably a post exposure bake unit that performs a post-exposure bake on a wafer having the thin photo-resist layer deposited thereon, after the ray exposing process. In a preferred embodiment, this process is performed at one of the positions marked PEB in FIG. 4.

The third bake unit 163 is a hard bake unit that performs a hard bake on the photo-resist layer pattern, after completion of development in the development unit 180. In a preferred embodiment, this process is performed at one of the positions marked HP in FIG. 4.

The reference symbol HHP in FIG. 4 indicates a bake unit provided for use in a wafer baking process that requires a higher baking temperature. In such a case, a slow cooling process is performed by the cooling units 150 (indicated as COL in FIG. 4) to bring a wafer to room temperature after all the previous processes have been performed at the adhesion unit 140 and the first, second, and third bake units 161, 162, and 163.

As shown in FIG. 4, the adhesion unit 140 is positioned under the cooling unit 150 and the first, second, and third bake units 161, 162, and 163. However, the position of the adhesion unit 140 is not fixed, but is determined by the airflow of the production line where the in-line photolithography device 400 is installed, in accordance with a preferred embodiment of the present invention. In other words, positions of the adhesion unit 140, cooling unit 150, and bake unit 160 should be considered according to the airflow of a production line. This is because a failure in patterning a photo-resist layer occurs according to the process features of the adhesion unit 140, i.e., the flow of ammonia gas that is generated during operational processes in the adhesion unit 140.

More specifically, if air flows downward in a production line, and if the adhesion unit 140 is installed higher than a bake unit 160 or a cooling unit 150, a small quantity of the ammonia gas generating during operation of the adhesion unit 140 may flow to the bake unit 160 or the cooling unit 150. This would be undesirable, because if ammonia gas flows into the bake unit 160, the previously described T-top phenomenon may occur in the photo-resist layer, resulting in an operational failure.

In accordance with a preferred embodiment of the present invention, air flows downward in the production line, from the ceiling to the floor. As a result, the adhesion unit 140 is first installed on the base body 110, and the cooling unit 150 or bake unit 160 is then installed above the adhesion unit 140, thereby preventing the occurrence of any operational failure caused by contamination by ammonia gas.

As shown in FIG. 2, the wafer transfer unit 130 is provided in an empty space formed between the bake unit 160, cooling unit 150 and adhesion unit 140, and the spin coating unit 170 and developing unit 180. The wafer transfer unit 130 operates to transfer wafers between units, e.g., from a bake unit 160 to a cooling unit 150, from an adhesion unit 140 to a cooling unit 150, from a spin coating unit 170 to a bake unit 160, and from a developing unit 180 to a bake unit 160. The wafer transfer unit 130 includes a guide rail 131, a transfer unit 132 linearly reciprocating along the guide rail 131, and a robot arm 133 installed at the transfer unit 132 for freely moving in the empty space to load/unload wafers.

Also, exposing unit 300 may be a stepper ray exposing unit or a scan type ray exposing unit, and is installed close to the photo-resist treating unit 100. Interface buffer unit 200 is installed between the ray exposing unit 300 and the photo-resist treating unit 100. The interface buffer unit 200 is used to transfer wafers from the photo-resist treating unit 100 to the ray exposing unit 300, or from the ray exposing unit 300 to the photo-resist treating unit 100.

Operational effects of the in-line type of photolithography device 400 according to a preferred embodiment of the present invention will be described as follows, with respect to processes of forming a photo-resist layer onto a sheet of wafers.

First, a sheet of wafers is unloaded out of the wafer cassette loading/unloading unit 120 by the robot arm 133 of the wafer transfer unit 130, and are loaded into one of the adhesion units 140 installed close to the base body 110. Then, a process is performed for enhancing the adhesion between the wafers and the photo-resist layer using HMDS gas. At this time, ammonia gas generated during the process to reinforce the adhesion between the wafers and photo-resist layer exhausts out without influencing the bake unit 160 or the cooling unit 150, since the air flows downward at the adhesion units 140 away from the bake and cooling units 160 and 150.

After the completion of the process at the adhesion unit 140, the wafer is transferred by the wafer transfer unit 130 into the cooling unit 150 to be slowly cooled down. Then, the cooled wafer is transferred to the spin coating unit 170 to form a photo-resist layer on the wafer. After the formation of the photo-resist layer, the wafer is transferred to the first bake unit 161 for a soft bake process and is then further transferred to the cooling unit 150 to be slowly cooled down.

Then, after the completion of the soft bake process and subsequent cooling, the wafer is transferred to the interface buffer unit 200 and, then to the ray exposing unit 300 where a ray exposing process is performed according to a set pattern. After the completion of the ray exposing process, the wafer is transferred through the interface buffer unit 200 to the second bake unit 162 to perform a post exposure bake process.

After completion of the post exposure bake process, the wafer is transferred by the wafer transfer unit 130 to the cooling unit 150 to be slowly cooled down. Then, the wafer is transferred to one of the developing units 180 to perform the developing process to form a photo-resist layer. After the completion of the developing process, the wafer is transferred by the wafer transfer unit 130 to the third bake unit 163 to perform a hard bake process. Finally, after the completion of the hard bake process, the wafer is transferred to one of the cooling units 150 to be cooled down, and then to the wafer cassette loading/unloading unit 120.

As described above, there is an advantage in the semiconductor fabricating equipment of the present invention in that, when a variety of operational processes are sequentially performed, a deteriorating material generated or used during a first process does not harmfully influence a later process, and does not cause any operational failure in the course of the semiconductor fabricating processes.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor fabricating device, comprising:
   an adhesion unit installed on a base body in a production line, the adhesion unit having an adhesion chamber that supplies an adhesion enhancing material that reinforces adhesion between a wafer and a photoresist layer when the photoresist layer is deposited on the wafer and that generates a process deteriorating gas;
   a cooling unit installed in the production line to cool down the wafer transferred from the adhesion unit; and
   a bake unit installed in the production line, the bake unit being adapted to bake the wafer having the photoresist layer formed thereon, the baking being susceptible to operational failures if exposed to the process deteriorating gas,
   wherein the bake unit and the cooling unit are installed at a higher level than the adhesion unit, and
   wherein clean air flows downward over the adhesion, cooling, and bake units to carry the process deteriorating gas away from the bake unit and cooling unit.

2. The semiconductor fabricating device of claim 1, wherein the process deteriorating gas is ammonia ($NH_4$).

3. The semiconductor fabricating device of claim 1, further comprising a cooling unit also installed in the production line, the cooling unit being adapted to cool the wafer after it leaves the adhesion unit and before the photoresist layer is deposited on the wafer,
   wherein the cooling unit is installed at a higher level than the adhesion unit, and
   wherein clean air flows downward over the cooling unit to carry the process deteriorating gas away from the cooling unit.

4. A semiconductor fabricating device, comprising:
   an adhesion unit installed on a base body in a production line, the adhesion unit having an adhesion chamber that supplies an adhesion enhancing material that reinforces adhesion between a wafer and a photoresist layer when the photoresist layer is deposited on the wafer and that generates a process deteriorating gas;
   a cooling unit installed in the production line to cool down the wafer transferred from the adhesion unit; and
   a bake unit installed in the production line, the bake unit being adapted to bake the wafer having the photoresist layer formed thereon, the baking being susceptible to operational failures if exposed to the process deteriorating gas,
   wherein the adhesion unit is installed at a first position, the bake unit is installed at a second position, and the cooling unit is installed at a third position, and
   wherein clean air flows from the second and third positions where the bake unit and cooling unit are installed to the first position where the adhesion unit is installed, to carry the process deteriorating gas away from the bake unit and the cooling unit.

5. The semiconductor fabricating device of claim 4, wherein the processing deteriorating gas is ammonia ($NH_4$).

6. The semiconductor fabricating device of claim 4, wherein the second and third positions are at a higher location within the semiconductor fabricating device than the first position.

7. A method of fabricating a semiconductor device comprising:
   performing first semiconductor fabricating processes at a first location installed on a base body in a production line, the first semiconductor fabricating processes generating a process deteriorating gas;
   performing second semiconductor fabricating processes that are dependent on the first semiconductor fabricating processes at a second location and a third location, the second semiconductor fabricating processes being susceptible to operational failures upon exposure to the process deteriorating gas; and
   flowing clean air from the second location and the third location to the first location to carry the process deteriorating gas away from the second location and the third location,
   wherein the first semiconductor fabricating processes include supplying an adhesion enhancing material that reinforces adhesion between a wafer and a photoresist layer when the photoresist layer is deposited onto the wafer, and
   wherein the second semiconductor fabricating processes include baking and cooling down the wafer having the photoresist layer thereon.

8. The method of fabricating a semiconductor device of claim 7, wherein the process deteriorating gas is ammonia ($NH_4$).

9. The method of fabricating a semiconductor device of claim 7, wherein the second location is higher than the first location.

10. The method of fabricating a semiconductor device of claim 7, wherein the second semiconductor fabricating processes are performed after the first semiconductor fabricating processes.

11. A semiconductor fabricating device, comprising:
    a first semiconductor process unit installed in a production line that performs first semiconductor fabricating processes and that generates a process deteriorating gas during the first semiconductor fabricating process; and
    second semiconductor process units installed in the production line that perform second semiconductor fabricating processes dependent on the first semiconductor fabricating processes, the second semiconductor fabricating processes being susceptible to operational failures if exposed to the process deteriorating gas,
    wherein the first semiconductor process unit is an adhesion unit,
    wherein the second semiconductor process units comprise bake and cooling units, and
    wherein all of the second semiconductor process units are installed so that clean air flows over the first and second semiconductor process units to carry the process deteriorating gas away from the second semiconductor process units.

12. The semiconductor fabricating device of claim 11, wherein all the second semiconductor process units are installed at a higher level than the adhesion unit when clean air flows downward over the first and second semiconductor process units to carry the process deteriorating gas away from the second semiconductor process units.

13. The semiconductor fabricating device of claim 11, wherein all the second semiconductor process units are installed at a lower level than the adhesion unit when clean air flows upward over the first and second semiconductor process units to carry the process deteriorating gas away from the second semiconductor process units.

14. The semiconductor fabricating device of claim 11, wherein the second semiconductor process units comprise process units being susceptible to operational failures if exposed to the process deteriorating gas.

15. The semiconductor fabricating device of claim 11, wherein the second semiconductor process units comprise bake units and cooling units.

16. The semiconductor fabricating device of claim 11, wherein the adhesion unit is installed on a base body when clean air flows downward over the adhesion and second semiconductor process units to carry the process deteriorating gas away from the second semiconductor process units.

17. The semiconductor fabricating device of claim 11, wherein the adhesion unit is installed on a base body.

* * * * *